(12) United States Patent
Xu

(10) Patent No.: US 11,721,688 B2
(45) Date of Patent: Aug. 8, 2023

(54) ELECTROSTATIC PROTECTION CIRCUIT, INTEGRATED CIRCUIT AND ELECTROSTATIC DISCHARGE METHOD

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 48 days.

(21) Appl. No.: 17/595,464

(22) PCT Filed: Mar. 10, 2021

(86) PCT No.: PCT/CN2021/079970
§ 371 (c)(1),
(2) Date: Nov. 17, 2021

(87) PCT Pub. No.: WO2021/180120
PCT Pub. Date: Jun. 19, 2021

(65) Prior Publication Data
US 2022/0208754 A1 Jun. 30, 2022

(30) Foreign Application Priority Data
Mar. 12, 2020 (CN) .......................... 202010169211.3

(51) Int. Cl.
*H01L 27/02* (2006.01)
*H02H 9/04* (2006.01)

(52) U.S. Cl.
CPC ......... *H01L 27/0266* (2013.01); *H02H 9/046* (2013.01)

(58) Field of Classification Search
CPC . H01L 27/0266; H01L 27/0285; H01L 27/02; H02H 9/046; H02H 9/04
(Continued)

(56) References Cited

U.S. PATENT DOCUMENTS 10,033,177 B2 * 7/2018 Kato ...................... H02H 9/041
10,348,085 B2 * 7/2019 Ikeda ................. H01L 27/0262
(Continued)

FOREIGN PATENT DOCUMENTS

CN          1581481 C     2/2005
CN        103001200 A     3/2013
(Continued)

OTHER PUBLICATIONS

Masuhide Ikeda; Title; electrostatic protection circuit and semiconductor integrated circuit apparatus; Drawings, speficiation, abstract (Year: 2015).*

(Continued)

*Primary Examiner* — Dharti H Patel

(74) *Attorney, Agent, or Firm* — Cooper Legal Group, LLC

(57) ABSTRACT

The present application relates to electrostatic protection circuit, integrated circuit and electrostatic discharge method. The electrostatic protection circuit includes: pulse detection unit configured to detect an electrostatic pulse, with first terminal connected to first pad, second terminal connected to second pad, and output terminal outputting a detection result signal; discharge transistor with gate connected to the pulse detection unit, drain connected to the first pad, and source connected to the second pad, configured to conduct the source and the drain when static electricity occurs in the first pad or the second pad, to discharge electrostatic charges; and processing unit connected to the pulse detection unit and the discharge transistor, configured to control ON and OFF of the discharge transistor based on the detection result signal, (Continued)

the processing unit including: a feedback delay circuit configured to extend an ON period of the discharge transistor during the discharge of the electrostatic charges.

9 Claims, 2 Drawing Sheets

(58) Field of Classification Search
USPC .......................................................... 361/56
See application file for complete search history.

(56) References Cited

U.S. PATENT DOCUMENTS

| | | | |
|---|---|---|---|
| 2005/0231878 A1 | 10/2005 | Krasin | |
| 2010/0296212 A1* | 11/2010 | Liang | H02H 9/046 361/56 |
| 2013/0170081 A1 | 7/2013 | Singh | |
| 2014/0192445 A1* | 7/2014 | Ikeda | H02H 9/046 361/56 |
| 2015/0162745 A1* | 6/2015 | Ikeda | H01L 27/0248 361/56 |
| 2015/0162746 A1* | 6/2015 | Ikeda | H02H 9/046 361/56 |
| 2016/0149403 A1* | 5/2016 | Ikeda | H02H 9/041 361/56 |
| 2022/0140598 A1* | 5/2022 | Xu | H02H 1/0007 361/56 |

FOREIGN PATENT DOCUMENTS

| | | |
|---|---|---|
| CN | 103001205 A | 3/2013 |
| CN | 104701312 A | 6/2015 |
| CN | 105470938 A | 4/2016 |
| CN | 107278326 A | 10/2017 |
| CN | 110445114 A | 11/2019 |

OTHER PUBLICATIONS

International Search Report as cited in PCT Application No. PCT/CN2021/079970 dated Jun. 4, 2021, 4 pages.

Zeng, Qinggui "Integrated Circuit Layout Design Course",pp. 228-pp. 235, Shanghai Science and Technology Press, Mar. 2012.

\* cited by examiner

ELECTROSTATIC PROTECTION CIRCUIT, INTEGRATED CIRCUIT AND ELECTROSTATIC DISCHARGE METHOD

CROSS-REFERENCE TO RELATED APPLICATIONS

This application claims priority to Chinese Patent Application No. 202010169211.3, titled "ELECTROSTATIC PROTECTION CIRCUIT, INTEGRATED CIRCUIT AND ELECTROSTATIC DISCHARGE METHOD" and filed on Mar. 12, 2020, the entire contents of which are incorporated herein by reference.

TECHNICAL FIELD

The present application relates to the field of integrated circuits, and more particularly, to an electrostatic protection circuit, an integrated circuit and an electrostatic discharge method.

BACKGROUND

An electrostatic discharge protection circuit (ESD circuit) is designed to provide a low-impedance current path to extract electrostatic charges. In general, designs of existing ESD mainly take into account a layout area, a starting current, a leakage current from VDD to VSS, and mechanisms to avoid false triggers in operation.

Insufficient discharge of electrostatic charges often occurs in the prior art, which, in this case, leads to a poor electrostatic protection effect of an electrostatic protection circuit, damages the functional circuit protected by the electrostatic protection circuit since electrostatic charges not discharged on a pad are still likely to affect a functional circuit, and seriously affects the service life of an integrated circuit.

SUMMARY

An objective of the present invention is to provide an electrostatic protection circuit, an integrated circuit and an electrostatic discharge method, which can discharge static electricity more thoroughly and improve a protection effect on a protected circuit.

In order to solve the above technical problems, an electrostatic protection circuit is provided below, including: a pulse detection unit configured to detect an electrostatic pulse, with a first terminal connected to a first pad, a second terminal connected to a second pad, and an output terminal outputting a detection result signal; a discharge transistor with a gate connected to the pulse detection unit, a drain connected to the first pad, and a source connected to the second pad, configured to conduct the source and the drain when static electricity occurs in the first pad or the second pad, so as to discharge electrostatic charges; and a processing unit connected to the pulse detection unit and the discharge transistor respectively, configured to control ON and OFF of the discharge transistor based on the detection result signal, the processing unit including: a feedback delay circuit configured to extend an ON period of the discharge transistor during the discharge of the electrostatic charges, the feedback delay circuit including: a first PMOS transistor with a source connected to the first pad and a gate connected to the pulse detection unit; a first NMOS transistor with a source connected to the second pad, a drain connected to the pulse detection unit, and a gate connected to a drain of the first PMOS transistor; and a first resistor arranged between the gate of the first NMOS transistor and the second pad.

Optionally, the processing unit further includes: an inverter group including at least one inverter and arranged between the feedback delay circuit and the pulse detection unit.

Optionally, the inverter group includes a first inverter connected to the pulse detection unit and a second inverter connected to the feedback delay circuit.

Optionally, the first inverter includes: a second PMOS transistor with a source connected to the first pad, a gate connected to the pulse detection unit, and a drain connected to an input terminal of the second inverter; and a second NMOS transistor with a source connected to the source of the second PMOS transistor, a gate connected to the pulse detection unit, and a drain connected to the second pad; and the second inverter includes: a third PMOS transistor with a source connected to the first pad, a gate connected to an output terminal of the first inverter, and a drain connected to an input terminal of the feedback delay circuit; and a third NMOS transistor with a source connected to the source of the third PMOS transistor, a gate connected to the output terminal of the first inverter, and a drain connected to the second pad.

Optionally, the pulse detection unit includes: a second resistor with one end connected to the first pad and the other end connected to an input terminal of the feedback delay circuit; and a capacitor with one end connected to the second pad and the other end connected to the input terminal of the feedback delay circuit.

Optionally, the second resistor and the capacitor have a product of at least 0.08 to 0.7 in microseconds.

Optionally, the discharge transistor includes a fourth NMOS transistor with a drain connected to the first pad, a source connected to the second pad, and a gate connected to an output terminal of the processing unit.

Optionally, the discharge transistor during the discharge of the electrostatic charges has an ON period of at least 0.1 to 1 microseconds.

In order to solve the above technical problems, an integrated circuit is further provided below, including the electrostatic protection circuit configured to discharge static electricity for a pad on the integrated circuit.

In order to solve the above technical problems, an electrostatic discharge method using the electrostatic protection circuit for electrostatic discharge is further provided below, including the following steps: providing a discharge transistor connected to a first region and a second region requiring electrostatic discharge protection; controlling the discharge transistor to be switched on when surfaces of the first region and the second region are electrostatically charged, an ON period being at least a preset period; and controlling the discharge transistor to be switched off when discharge of static electricity is not required.

The electrostatic protection circuit, the integrated circuit and the electrostatic discharge method in the present application guarantee the ON period of the discharge transistor during the discharge of the electrostatic charges, and ensure as much as possible that the electrostatic charges are discharged more thoroughly, so as to prevent damages to the functional circuit due to the electrostatic charges acting on a protected functional circuit.

Moreover, due to the feedback delay circuit, the ON time of the discharge transistor can be extended through feedback, and thus requirements on the pulse detection unit can be reduced, so that the ON period can be long enough without arrangement of a pulse detection unit with a large characteristic time, so as to ensure sufficient discharge of the electrostatic charges. In this way, the occupation of the layout space of the integrated circuit by components in the pulse detection unit can be reduced while the ON period of the discharge transistor is ensured. Further, the electrostatic protection circuit further includes an inverter group, which can amplify and buffer electrical signals, buffer off noise of part of the electrical signals, prevent the impact of the noise on the electrostatic protection circuit, and ensure that a voltage can be large enough to drive the discharge transistor to be switched on.

BRIEF DESCRIPTION OF DRAWINGS

In order to more clearly illustrate the technical solutions in embodiments of the present application, the accompanying drawings used in the description of the embodiments of the present application will be briefly introduced below. It is apparent that, the accompanying drawings in the following description are only some embodiments of the present application, and other drawings can be obtained by those of ordinary skill in the art from the provided drawings without creative efforts.

DESCRIPTION OF EMBODIMENTS

In order to make the objectives, technical means and effects of the present application clearer, the present application will be further elaborated with reference to the accompanying drawings. It should be understood that the embodiments described herein are only a part of rather than all of the embodiments of the present application, and are not intended to limit the present application. All other embodiments obtained by those skilled in the art based on the embodiments in the present application without creative efforts fall within the protection scope of the present application.

According to research findings, the reason why electrostatic discharge of a pad is not thorough is that a discharge transistor of an electrostatic protection circuit should maintain an on-state when discharging electrostatic charges, but an ON period of the discharge transistor is not long enough, which may directly result in the fact that the discharge transistor of the electrostatic protection circuit cannot discharge the electrostatic charges on a surface of a pad completely.

In some embodiments, a discharge ON period of the discharge transistor of the electrostatic protection circuit is extended with a method of increasing an RC characteristic time. However, a requirement for an excessive RC characteristic time may lead to an increase in a required capacitor or resistor, which may directly lead to an increase in a size of the capacitor or resistor and affect layout design of an integrated circuit.

In one embodiment, an RC characteristic time is related to a product of resistance and capacitance in a pulse detection unit in the electrostatic protection circuit. The discharge transistor can have a sufficient ON period by setting a large enough capacitor or resistor. However, the large enough capacitor or resistor is also large-sized, which occupies much layout space of the integrated circuit. For example, the characteristic time of the pulse detection unit is set to 0.1 to 1 microseconds, and there is a need to set, on a surface of a circuit board, that R is an N+ diffusion resistor of 50 kOhm and C is an NMOS capacitor of 20 pF, which may occupy much layout space and also make the electrostatic protection circuit vulnerable to noise.

An electrostatic protection circuit, an integrated circuit and an electrostatic discharge method according to the present application are described below in further detail with reference to the accompanying drawings and embodiments.

Figure 1:
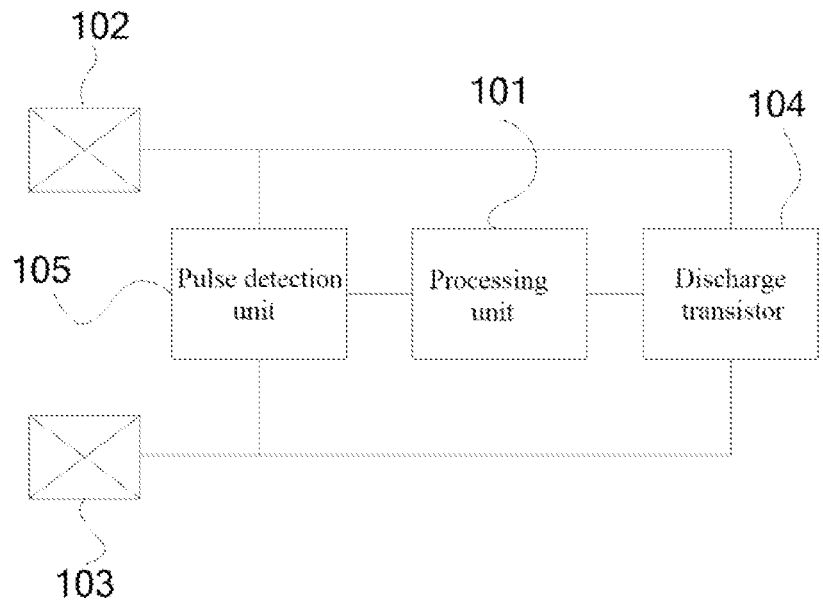
FIG. 1 is a schematic diagram of a connection relationship of an electrostatic protection circuit according to an embodiment of the present application.

Refer to FIG. 1, which is a schematic diagram of a connection relationship of an electrostatic protection circuit according to an embodiment of the present application.

Figure 2:
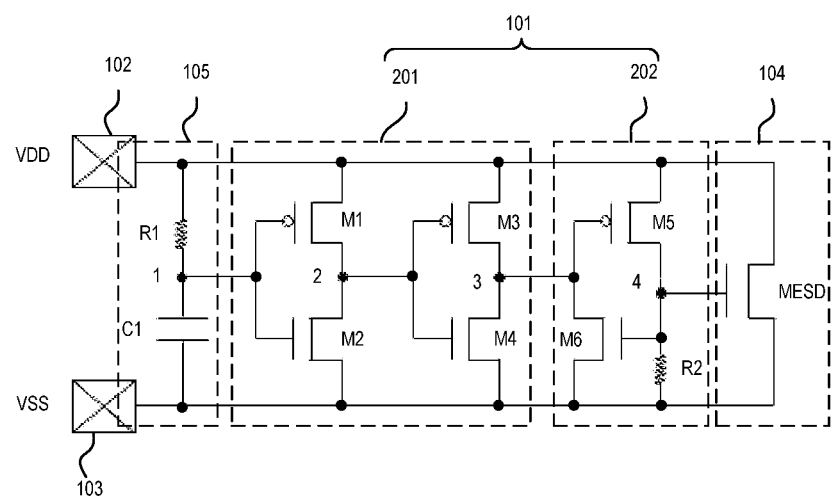
FIG. 2 is a schematic diagram of a connection relationship of an electrostatic protection circuit according to an embodiment of the present application.

In the embodiment, an electrostatic protection circuit is provided, including: a pulse detection unit 105 configured to detect an electrostatic pulse, with a first terminal connected to a first pad 102, a second terminal connected to a second pad 103, and an output terminal outputting a detection result signal; a discharge transistor 104 with a gate connected to the pulse detection unit 105, a drain connected to the first pad 102, and a source connected to the second pad 103, configured to conduct the source and the drain when static electricity occurs in the first pad 102 or the second pad 103, to discharge electrostatic charges; and a processing unit 101 connected to the pulse detection unit 105 and the discharge transistor 104, configured to control ON and OFF of the discharge transistor 104 based on the detection result signal. Referring to FIG. 2, the processing unit 101 includes: a feedback delay circuit 202 configured to extend an ON period of the discharge transistor 104 during the discharge of the electrostatic charges, the feedback delay circuit 202 including: a first PMOS transistor M5 with a source connected to the first pad 102 and a gate connected to the pulse detection unit 105; a first NMOS transistor M6 with a source connected to the second pad 103, a drain connected to the pulse detection unit 105, and a gate connected to a drain of the first PMOS transistor M5; and a first resistor R2 arranged between the gate of the first NMOS transistor M6 and the second pad 103.

The electrostatic protection circuit in the embodiment includes the feedback delay circuit 202, which can extend the ON period of the discharge transistor 104 during the discharge of the electrostatic charges without arranging a larger capacitor to extend a discharge period of the electrostatic charges of the discharge transistor 104, thereby occupying less layout space of the integrated circuit and releasing the electrostatic charges more thoroughly.

In one embodiment, the pulse detection unit 105 includes: a second resistor R1 with one end connected to the first pad 102 and the other end connected to an input terminal of the feedback delay circuit 202; and a capacitor C1 with one end connected to the second pad 103 and the other end connected to the input terminal of the feedback delay circuit 202.

In the embodiment, equivalent resistance of the capacitor C1 may change when static electricity happens in the two pads, causing a potential change at Point 1 in FIG. 2, which may be outputted into the feedback delay circuit 202 as a detection result signal. The feedback delay circuit 202 drives or does not drive the discharge transistor MESD based on the detection result signal.

In the embodiment shown in FIG. 2, the equivalent resistance of the capacitor C1 between the first pad 102 and the second pad 103 may change if there is electrostatic charge accumulation on the first pad 102 and the second pad is grounded. At the moment of the electrostatic charge accumulation, Point 1 in FIG. 1 is at a low level. Therefore, Point 3 in FIG. 1 is at a low level at this time.

In the embodiment, a product of the second resistor R1 and the capacitor C1 of the pulse detection unit 105 directly affects an electrostatic discharge period of the electrostatic protection circuit in one electrostatic discharge process. The product of the second resistor R1 and the capacitor C1 of the pulse detection unit 105 is equal to a characteristic time of the pulse detection unit 105. The characteristic time is related to the ON period of the discharge transistor 104 during the discharge of the electrostatic charges. The greater the product of the second resistor R1 and the capacitor C1 of the pulse detection unit 105 is, the longer the ON time of the discharge transistor 104 is, and the more thoroughly the electrostatic charges on the pad are discharged.

In some embodiments, the second resistor R1 and the capacitor C1 has a product of at least 0.08 to 0.7 in microseconds.

In the embodiment, a requirement on the characteristic time of the pulse detection unit 105 is reduced by arranging the feedback delay circuit 202. The feedback delay circuit 202 can effectively extend the ON period of the two pads when discharge of the electrostatic charges is required, and thus the requirement on the characteristic time of the pulse detection unit 105 can be effectively reduced, preventing the excessive capacitor C1 from occupying the layout space of the integrated circuit.

In the embodiment, the ON period of the discharge transistor 104 should be ensured to be long enough, thereby ensuring sufficient discharge of the electrostatic charges. In some embodiments, the discharge transistor 104 during the discharge of the electrostatic charges has an ON period of at least 0.1 to 1 microseconds.

In the embodiment shown in FIG. 2, the pulse detection unit 105, the feedback delay circuit 202 and the discharge transistor 104 are sequentially connected. The pulse detection unit 105 and the feedback delay circuit 202 control the discharge transistor 104 to be switched on when the first pad 102 or the second pad 103 is electrostatically charged, so as to discharge electrostatic charges of the first pad 102 to the second pad 103 or discharge electrostatic charges of the second pad 103 to the first pad 102. In the embodiment, the electrostatic protection circuit can protect a functional circuit connected to the first pad 102 and the second pad 103, release the electrostatic charges on the pad, and prevent the failure of the functional circuit due to the electrostatic charges moving to the functional circuit.

In one embodiment, the discharge transistor 104 includes a fourth NMOS transistor MESD with a drain connected to the first pad 102, a source connected to the second pad 103, and a gate connected to an output terminal of the processing unit 101.

In the embodiment, the discharge transistor 104 is an NMOS transistor, applicable to high-level drive. Therefore, in the embodiment, the processing unit 101 should output a high level to drive the discharge transistor 104 to be switched on when static electricity exists. In fact, a PMOS transistor may also be used as the discharge transistor 104. In this case, a specific structure of the processing unit 101 is required to be changed, so that the processing unit 101 outputs a low level to drive the discharge transistor 104 to be switched on.

In one embodiment, the processing unit 101 further includes: an inverter group 201 including at least one inverter and arranged between the feedback delay circuit 202 and the pulse detection unit 105. The inverter group 201 arranged between the feedback delay circuit 202 and the pulse detection unit 105 can invert and amplify the detection result signal from the pulse detection unit 105, so that a signal finally outputted to the discharge transistor 104 is large enough to drive the discharge transistor 104.

In one embodiment, in the case of an even number of inverters in the inverter group 201, signals outputted from the inverter group 201 are in phase with the detection result signal. In other embodiments, in the case of an odd number of inverters in the inverter group 201, the signals outputted from the inverter group 201 are in antiphase with the detection result signal.

In one embodiment, the inverter group 201 includes a first inverter connected to the pulse detection unit 105 and a second inverter connected to the feedback delay circuit 202. This causes the detection result signal to be inverted and amplified at least twice before it can flow to the feedback delay circuit 202 and the discharge transistor 104. Since signals outputted to the inverter group 201 may all be inverted and amplified at least twice, the signals outputted to the inverter group 201 can be rectified to filter out some electrical noise to prevent some noise signals from affecting the on-state of the discharge transistor 104. In other embodiments, the number of the inverters in the inverter group 201 may be set as required.

In one embodiment, the first inverter includes: a second PMOS transistor M1 with a source connected to the first pad 102, a gate connected to the pulse detection unit 105 to serve as an input terminal of the first inverter, and a drain, as an output terminal of the first inverter, connected to an input terminal of the second inverter; and a second NMOS transistor M2 with a drain connected to the drain of the second PMOS transistor M1, a gate connected to the gate of the second PMOS transistor M1, and a source connected to the second pad 103; and the second inverter includes: a third PMOS transistor M3 with a source connected to the first pad 102, a gate, as the input terminal of the second inverter, connected to the output terminal of the first inverter, and a drain, as an output terminal of the second inverter, connected to the input terminal of the feedback delay circuit 202; and a third NMOS transistor M4 with a drain connected to the drain of the third PMOS transistor M3, a gate connected to the gate of the third PMOS transistor M3, and a source connected to the second pad 103.

In the embodiment shown in FIG. 2, the inverter group 201 includes only the first inverter and the second inverter, the first inverter inverts and amplifies an electrical signal inputted from Point 1 in FIG. 2 for the first time, the output terminal of the first inverter is connected to the input terminal of the second inverter, and the second inverter inverts and amplifies the output of the first inverter for the second time.

In the embodiment shown in FIG. 2, the pulse detection unit 105 is connected before the inverter group 201, and the feedback delay circuit 202 is connected after the inverter group 201. A delay effect on a discharge ON period of the discharge transistor 104 is achieved through the feedback delay circuit 202.

In the embodiment, the fourth NMOS transistor MESD is a device turned on at a high level. Therefore, the fourth NMOS transistor MESD is switched on when a high level is provided at Point 4 in FIG. 2, and the fourth NMOS transistor MESD is switched off when a low voltage is provided at Point 4 in FIG. 2.

In one embodiment, VDD is applied to the first pad 102 which serves as a power source terminal, and the second pad 103 is grounded. Point 1 in FIG. 2 is at a high level when no electrostatic charge accumulation occurs on the first pad 102 or the second pad 103. Point 3 in FIG. 2 is still at a high level after the inversion by the two inverters of the inverter group 201.

In this case, the input terminal of the feedback delay circuit 202 is connected to Point 3 in FIG. 2 which is at a high level, a gate voltage of the first PMOS transistor M5 is at a high level, the first PMOS transistor M5 is not switched on, and the equivalent resistance between the source and the drain of the first PMOS transistor M5 is much greater than the resistance of the first resistor R2. Therefore, Point 4 in the figure is at a low level (approximately VSS) after voltage division, then the first NMOS transistor and the fourth NMOS transistor MESD are switched off, and the first pad 102 and the second pad 103 are not communicated through the fourth NMOS transistor MESD.

In the embodiment, in the case of an electrostatic charge accumulation on the first pad 102, Point 1 of FIG. 2 is at a low level, and Point 3 of FIG. 2 is also at a low level after passing through the two inverters. Therefore, the gate of the first PMOS transistor M5 is connected to the low level point and is switched on. In this case, the equivalent resistance between the source and the drain of the first PMOS transistor is much less than the resistance of the first resistor R2. Therefore, Point 4 in the figure is at a high level (approximately VDD) after voltage division, then the fourth NMOS transistor MESD is switched on, and electrostatic charges on the first pad 102 are discharged to the second pad 103.

In this case, the gate of the first NMOS transistor M6 is also connected to Point 4 in FIG. 2 at the high level. Therefore, the first NMOS transistor M6 is switched on, and the first resistor R2 may maintain the high level of the gate of the first NMOS transistor M6. Since the source of the first NMOS transistor M6 is connected to the ground to which the second pad 103 is connected, i.e., a point at the low level VSS, the gate of the first NMOS transistor M6 is also at a low level, the gate of the first PMOS transistor connected to the gate of the first NMOS transistor M6 is also at the low level VSS, so that the first PMOS transistor can continue to be switched on. The gate of the fourth NMOS transistor MESD is supplied with the high level VDD on the first pad 102, to turn on the fourth NMOS transistor MESD and connect the first pad 102 and the second pad 103 to maintain the discharge of the electrostatic charges. This can extend the ON period of the two pads when static electricity happens on the pads and ensure full discharge of the electrostatic charges.

Therefore, in the embodiment, even though the capacitive reactance of the capacitor C1 increases gradually with the discharge of the electrostatic charges, the voltage at Point 1 in FIG. 2 also increases gradually. However, due to the use of the feedback delay circuit 202, the ON period of the two pads can be extended to ensure that the electrostatic charges of the first pad 102 have enough time to flow to the second pad 103, so as to realize the discharge of the electrostatic charges.

Figure 3:
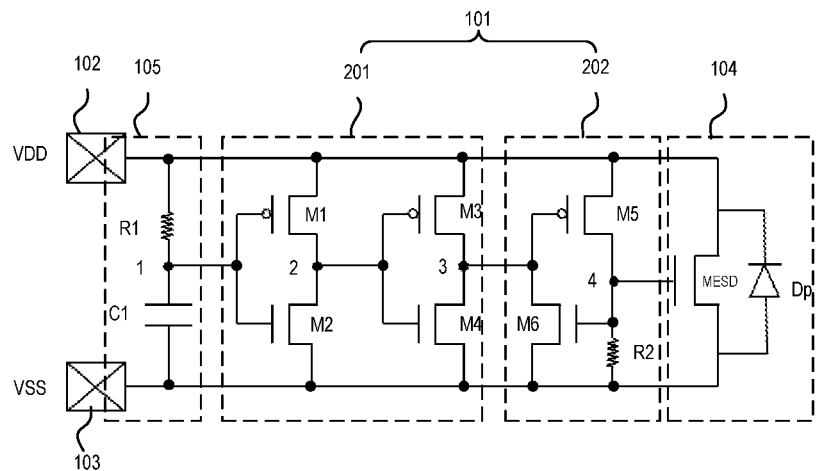
FIG. 3 is a schematic diagram of a connection relationship of an electrostatic protection circuit according to an embodiment of the present application.

The above embodiment is the working principle of the first pad 102 with static electricity. In fact, when static electricity happens on the second pad 103, refer to FIG. 3, which is a schematic diagram of a connection relationship of an electrostatic protection circuit according to an embodiment of the present application. In this case, the discharge of the electrostatic charges can be realized through parasitic capacitance Dp of the fourth NMOS transistor MESD, which is not analyzed herein.

In the embodiment, the discharge transistor 104 during the discharge of the electrostatic charges has an ON period of at least 0.1 to 1 microseconds. This ensures the electrostatic charge discharge effect of the electrostatic protection circuit.

In the embodiment, the electrostatic protection circuit is connected to the two pads at the same time, so it has a protection effect on a functional circuit connected to the two pads. Good electrostatic discharge protection can be achieved whether there is static electricity on the first pad 102 or on the second pad 103. Therefore, the electrostatic protection circuit has relatively strong electrostatic protection capability.

In the embodiment, an integrated circuit is further provided, including the electrostatic protection circuit configured to discharge static electricity for a pad on the integrated circuit.

In the embodiment, the integrated circuit can protect the functional circuit from electrostatic damages. Moreover, since the electrostatic protection circuit includes a feedback delay circuit 202, a period of electrostatic discharge can be extended to ensure as much as possible that the static electricity on the pad is completely discharged, thereby ensuring the protection effect of the electrostatic protection circuit and improving antistatic capability of the integrated circuit.

Figure 4:
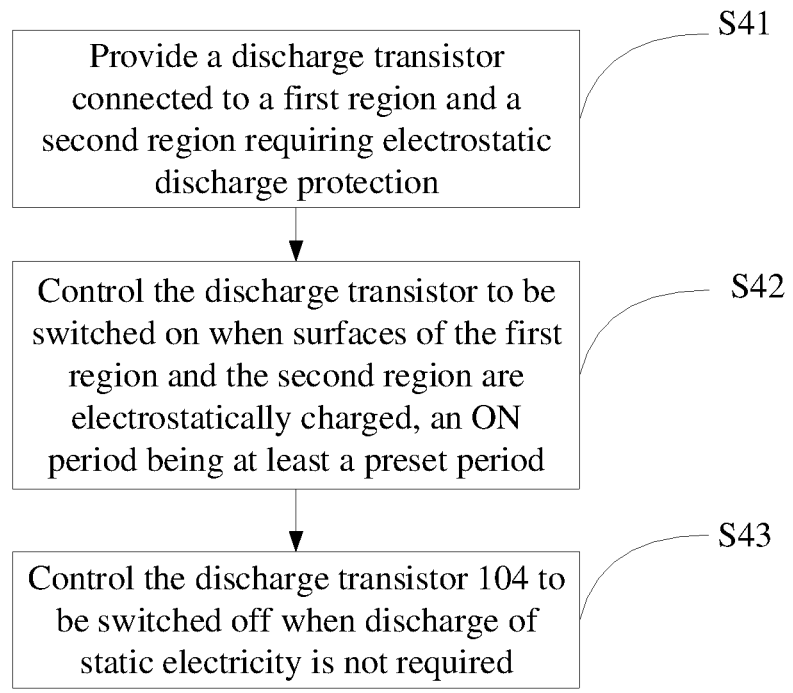
FIG. 4 is a schematic flowchart of steps of an electrostatic discharge method according to an embodiment of the present application.

FIG. 4 is a schematic flowchart of steps of an electrostatic discharge method according to an embodiment of the present application.

In the embodiment, an electrostatic discharge method using the electrostatic protection circuit for electrostatic discharge is provided, including the following steps: S41: providing a discharge transistor 104 connected to a first region and a second region requiring electrostatic discharge protection; S42: controlling the discharge transistor 104 to be switched on when surfaces of the first region and the second region are electrostatically charged, an ON period being at least a preset period; and S43: controlling the discharge transistor 104 to be switched off when discharge of static electricity is not required.

In the embodiment, full discharge of the electrostatic charges of the first region can be guaranteed by setting a long enough ON period of the discharge transistor 104, to prevent a functional circuit connected to the first region and the second region from being affected by incomplete discharge of the electrostatic charges.

In one embodiment, the preset period is 0.1 to 1 microseconds, and thus the ON period of the discharge transistor 104 when the discharge of the electrostatic charges is required is at least 0.1 to 1 microseconds. In the embodiment, the discharge transistor 104 is further connected to the pulse detection unit 105 and the processing unit 101. A first terminal of the pulse detection unit 105 is connected to the first region, a second terminal thereof is connected to the second region, and an output terminal thereof outputs a detection result signal to the processing unit 101. The ON period is guaranteed by the pulse detection unit 105 and the processing unit 101.

In the embodiment, the discharge transistor 104 is controlled to be switched off when the discharge of the electrostatic charges is not required. In this way, the functional circuit connected to the first region and the second region can operate normally when no electrostatic charge is discharged on surfaces of the first region and the second region.

The above are only preferred embodiments of the present application. It should be pointed out that, for those of ordinary skill in the art, various improvements and modifications can also be made without departing from the principle of the present application, and these improvements and modifications are also deemed to be within the protection scope of the present application.

What is claimed is:

1. An electrostatic protection circuit, comprising:
a pulse detection unit configured to detect an electrostatic pulse, with a first terminal connected to a first pad, a second terminal connected to a second pad, and an output terminal outputting a detection result signal;
a discharge transistor with a gate connected to the pulse detection unit, a drain connected to the first pad, and a source connected to the second pad, the discharge transistor configured to conduct the source and the drain when static electricity happens in the first pad or the second pad, to discharge electrostatic charges; and
a processing unit connected to the pulse detection unit and the discharge transistor, the processing unit configured to control ON and OFF of the discharge transistor based on the detection result signal, the processing unit comprising: a feedback delay circuit configured to extend an ON period of the discharge transistor during the discharge of the electrostatic charges, the feedback delay circuit comprising:
a first p-channel metal oxide semiconductor (PMOS) transistor with a source connected to the first pad and a gate connected to the pulse detection unit;
a first n-channel metal oxide semiconductor (NMOS) transistor with a source connected to the second pad, a drain connected to the pulse detection unit, and a gate connected to a drain of the first PMOS transistor; and
a first resistor arranged between the gate of the first NMOS transistor and the second pad,
wherein the processing unit further comprises:
an inverter group comprising at least one inverter and arranged between the feedback delay circuit and the pulse detection unit.

2. The electrostatic protection circuit according to claim 1, wherein the inverter group comprises a first inverter connected to the pulse detection unit and a second inverter connected to the feedback delay circuit.

3. The electrostatic protection circuit according to claim 2, wherein the first inverter comprises:
a second PMOS transistor with a source connected to the first pad, a gate connected to the pulse detection unit, and a drain connected to an input terminal of the second inverter; and
a second NMOS transistor with a source connected to the source of the second PMOS transistor, a gate connected to the pulse detection unit, and a drain connected to the second pad; and
the second inverter comprises:
a third PMOS transistor with a source connected to the first pad, a gate connected to an output terminal of the first inverter, and a drain connected to an input terminal of the feedback delay circuit; and
a third NMOS transistor with a source connected to the source of the third PMOS transistor, a gate connected to the output terminal of the first inverter, and a drain connected to the second pad.

4. The electrostatic protection circuit according to claim 1, wherein the pulse detection unit comprises:
a second resistor with one end connected to the first pad and a second end connected to an input terminal of the feedback delay circuit; and
a capacitor with one end connected to the second pad and a second end connected to the input terminal of the feedback delay circuit.

5. The electrostatic protection circuit according to claim 4, wherein the second resistor and the capacitor have a product of at least 0.08 to 0.7 in microseconds.

6. The electrostatic protection circuit according to claim 1, wherein the discharge transistor comprises a fourth NMOS transistor with a drain connected to the first pad, a source connected to the second pad, and a gate connected to an output terminal of the processing unit.

7. The electrostatic protection circuit according to claim 1, wherein the ON period of the discharge transistor during the discharge of the electrostatic charges is at least 0.1 to 1 microseconds.

8. An integrated circuit, comprising the electrostatic protection circuit according to claim 1 configured to discharge static electricity for a pad on the integrated circuit.

9. An electrostatic discharge method, using the electrostatic protection circuit according to claim 1 for electrostatic discharge, comprising:
providing the discharge transistor connected to a first region and a second region requiring electrostatic discharge protection;
controlling the discharge transistor to be switched on when surfaces of the first region and the second region are electrostatically charged, the ON period being at least a preset period; and
controlling the discharge transistor to be switched off when discharge of static electricity is not required.

* * * * *